(12) United States Patent
Summers et al.

(10) Patent No.: US 8,688,421 B2
(45) Date of Patent: Apr. 1, 2014

(54) METHOD TO DESIGN HONEYCOMBS FOR A SHEAR FLEXIBLE STRUCTURE

(75) Inventors: Joshua D. Summers, Clemson, SC (US); Luke A. Berglind, Greenville, SC (US); Jaehyung Ju, Sungnam (KR)

(73) Assignees: Compagnie Generale des Etablissements Michelin (FR); Michelin Recheche et Technique S.A. (CH)

( * ) Notice: Subject to any disclaimer, the term of this patent is extended or adjusted under 35 U.S.C. 154(b) by 291 days.

(21) Appl. No.: 13/076,542

(22) Filed: Mar. 31, 2011

(65) Prior Publication Data
US 2011/0240190 A1    Oct. 6, 2011

Related U.S. Application Data

(60) Provisional application No. 61/319,544, filed on Mar. 31, 2010.

(51) Int. Cl.
*G06G 7/48* (2006.01)

(52) U.S. Cl.
USPC .................................. 703/7; 703/6

(58) Field of Classification Search
USPC ............. 703/6, 7; 152/301, 302, 311, 11, 152/209.18, 540; 264/40.4, 40, 4
See application file for complete search history.

(56) References Cited

U.S. PATENT DOCUMENTS

| | | | |
|---|---|---|---|
| 1,440,974 A | 1/1923 | Dornburgh | |
| 2003/0121581 A1* | 7/2003 | Thompson et al. | 152/301 |
| 2006/0113016 A1* | 6/2006 | Cron et al. | 152/11 |
| 2010/0018621 A1* | 1/2010 | Thompsom | 152/302 |
| 2010/0193097 A1* | 8/2010 | McNier et al. | 152/311 |
| 2011/0253283 A1* | 10/2011 | Kaplan et al. | 152/540 |
| 2012/0031535 A1* | 2/2012 | Thompson | 152/209.18 |
| 2012/0228791 A1* | 9/2012 | Creasap et al. | 264/40.4 |

OTHER PUBLICATIONS

Balawi et al., "A refined model for the effective in-plane elastic moduli of hexagonal honeycomb", 2008.s.*
Balawi et al., "The effect of honeycomb relative density on its effective in-plane elastic moduli: An experimental study", 2008.*
Masters et al., "Models of elastic deformation of honeycombs", Composite structures, 1996.*
Chen et al. , "Analysis of in-plane elastic modulus for a hexagonal honeycomb core: Effect of core height and proposed analytical method", Composite structures, 2009.*
Berglind, L., "Design Tool Development for Cellular Structure Synthesis to Achieve Desired Properties", Clemson University, 2010.*
Method to Design Honeycombs for a Shear Flexible Structure;research paper dated Jan. 2010; copyright 2010 SAE international.
Ju, J., Summers, J., Ziegert, J., Fadel, G., (2009), "Design of Honeycomb meta-materials for high shear flexure" In Proceedings of the ASME 2009 International Design Engineering Techincal Conference, IDETC/CIE2009, San Diego, CA.

(Continued)

*Primary Examiner* — Kandasamy Thangavelu
(74) *Attorney, Agent, or Firm* — John Steckler Schwab (57) ABSTRACT

A design method for optimizing the shear layer of a shear band for use in a tire is provided. The shear layer has a honeycomb configuration and the design method optimizes the dimensions of the honeycomb.

9 Claims, 11 Drawing Sheets

(56) References Cited

OTHER PUBLICATIONS

Gibson, L. J., and Ashby, M. F., (1997), Cellular Solids Structure and Properties, 2nd ed. Cambridge, UK: Cambridge University Press.

Masters, I. G. and Evans, K. E., (1996), "Models for the Elastic Deformation of Honeycombs," Composite Structures, vo. 35, No. pp. 403-422.

Bezazi, A., Scarpa, F., and Remillar, C., (2005), "A Novel Centresymmetrlc Honeycomb Composite Structure," Composite Structures, vol. 71, No. 536-64.

Balawi, S. and Abot, J.L., (2008), "A Refined Model for the Effective in-Plane Elastic Moduli of Hexagonal Honeycombs," Composite Structures, vol. 84, No. pp. 147-158.

Gonella, S. and Ruzzene, M., (2008), "Homogenization and Equivalent in-Plane Properties of Two Dimensional Periodic Lattices," International Journal of Solid and Structures, vol. 45, No. pp. 2897-2915.

Wang, A. J. and Mcdowell, D. L., (2004), "In-Plane Stiffness and Yield Strength of Periodic Metal Honeycombs," Transactions of the ASME Journal of Engineering Materials and Technology, vol. 126, No, pp. 137-156.

Chung, J. and Wass, A. M., (1999), "Compressive Response and Failure of Circular Cell Polycarbonate Honeycombs under In-Plane Uniaxial Stresses," Transactions of the ASME Journal of Engineering Materials and Technology, vol. 121, No. pp. 494 502.

Papka, S. and Kyriakides, S., (1998), "In-Plane Crushing of a Polycarbonate Honeycomb," International Journal of Solid and Structures, vol. 35, No. pp. 239-267.

Scarpa, F., Blain, S., Perrott, D., Ruzzene, M., and Yates, J. R., (2007), "Elastic Buckling of Hexagonal Chirai Cell Honeycombs," Composites Part A, vol. 38, No. pp. 280-289.

Torquato, S., Gibiansky, L. V., Silva, M. I, and Gibson, L J., (1998), "Effective Mechanical and Transport Properties of Cellular Solids," International Journal of Mechanical Science, vol. 40, No. 1, pp. 71-82.

Gellatry, R. A., Bijlaard, P. P., and Gallahem, R. H., (1965). "Thermal Stress and instability of Sandwich Cylinders on Rigid Supports," Journal of Aircraft, vol. 2, No. 1, pp. 44-48.

Lin, W., (1996), "The Point Force Response of Sandwich Panels and Problems," in 37th Structures, Structural Dynamics, and AIAA/ASME/ASCE/AHS/ASC, Salt Lake City, UT April.

Becker, W., (2000), "Closed-Form Analysis of the Thickness Effect of Regular Honeycomb Core Material," Composite Structures, vol. 48, No. pp. 67-70.

Kapania, R. K., Soliman, H.E., Vasudeva, S., Hughes, O., and Makjecha, D, P., (2008), "Static Analysis of Sandwich Panels with Square Honeycomb Core," AIAA Journal vol. 46, No. 3, pp. 627-634.

Abdelal, G. F. and Atef, A., (2008), "Themal Fatigue Analysis of Solar Panel Structure for Micro•Satellite Applications," International Journal of Mechanics and Materials in Design; vol. 4, No. pp. 53-62.

Khire, R. A., Dessel, S.V., Messac, A., and Mullur, A.A., (2006), "Study of a Honeycomb-Type Rigidified Inflatable Structure for Housing," Journal of Structural Engineering, vol. 132, No. 10, pp. 1664-1672.

Olympia, K. R. and Gandhi, F., (2007), "Zero-v Cellular Honeycomb Flexible Skins for One-Dimensional Wing Morphing," in 48th Structures, Structural Dynamics, and Materials Conference, AIAA/ASME/ASCE/AHS/ASC, Honolulu, Hawaii Apr. 23-26.

Bubert. R A., Woods, B. K. S., Kothera, C. S., and Wereley, N. M., (2008), "Design and Fabrication of a Passive 1-D Morphing Aircraft Skin," in 49th Structures, Structural Dynamics, and Materials Conference, AIAA/ASME/ASCE/AHS/ASC,. Schaumburg, IL Apr. 7-10.

Seepersad, C. C., Allen, J. K., Mcdowell, D. L., and Mistree, F., (2008), "Multifunctional Topology Design of Cellular Material Structures," Journal of Mechanical Design, vol. 130, No. pp. 031404-031413.

Huang, J. S. and Gibson, L. J., (1999), "Microstructural Design of Cellular Materials—I: Honeycomb Beams and Plates," Acta Metallurgica et Materialia, vol. 43, No. pp. 1643-1650.

\* cited by examiner

METHOD TO DESIGN HONEYCOMBS FOR A SHEAR FLEXIBLE STRUCTURE

PRIORITY CLAIM

This application claims the benefit of previously filed U.S. Provisional Patent Application entitled "A New Method to Design Honeycombs for a Shear Flexible Structure", assigned U.S. Ser. No. 61/319,544, filed Mar. 31, 2010 and which is incorporated herein by reference in its entirety for all purposes.

BACKGROUND OF THE INVENTION

Conventional geometric parameters of honeycombs (cell height, h, cell length, l, and cell angle, θ) have been used to find effective properties of honeycomb structures. However, these parameters appear to be difficult to control both a target shear stiffness (4 to 4.5 MPa) and a certain level of shear strain (~10%) because the parameters are coupled to each other. A novel approach to design hexagonal honeycombs is suggested to be capable of controlling both shear stiffness and shear flexibility independently by defining two new parameters; effective height, R and horizontal separation, d. A numerical parametric study with commercial software, ABAQUS, is conducted using the two new parameters to investigate their affects on in-plane effective shear stiffness, $G_{12}^*$, and maximum shear strain, $(\gamma_{12}^*)_{max}$ of polycarbonate honeycombs under a fixed overall honeycomb height of 12.7 mm (0.5 in). The suggested approach is expected to be applied to design a light weight component requiring certain levels of shear stiffness and shear strain at the same time. For example, this component can be used as the shear layer for a shear band of a tire including those of the pneumatic, non-pneumatic and hybrid varieties.

The inventors are challenged with developing specialized materials that mimic elastomeric properties yet are composed of low dampening materials, thereby reducing energy loss under shear for use in the shear layer of a shear band of a tire. A solution may be found in a design of honeycombs. Our previous study on a design of shear flexure with honeycombs shows that cellular solids having negative Poisson's ratio, called auxetic, have high shear flexibility [Ju, J., Summers, J. d., Zigert, J., and Fadel, G, (2009), "Design of honeycomb meta-materials for high shear flexure," In Proceedings of the ASME 2009 International Design Engineering Technical Conference, IDETC/CIE 2009, San Diego, Calif.].

The hexagonal honeycombs have been studied as a basic cellular structure. Since the pioneering work on the honeycomb mechanics by Gibson and Ashby [Gibson, L. J. and Ashby, M. F., (1997), Cellular Solids Structure and Properties, 2nd ed. Cambridge, UK: Cambridge University Press], many analytical and numerical models to describe in-plane effective properties of honeycombs are available in the literature; for example, a refined cell wall's bending model by adding a beam's stretching and hinging motion [Masters, I. G. and Evans, K. E., (1996), "Models for the Elastic Deformation of Honeycombs," Composite Structures, vol. 35, no. pp. 403-22], a model with the energy method [Bezazi, A., Scarpa, F., and Remillat, C., (2005), "A Novel Centresymmetric Honeycomb Composite Structure," Composite Structures, vol. 71, no. 536-64], a refined model with round shape at cell edges [Balawi, S. and Abot, J. L., (2008), "A Refined Model for the Effective in-Plane Elastic Moduli of Hexagonal Honeycombs," Composite Structures, vol. 84, no. pp. 147-58], and a model using the homogenization method [Gonella, S. and Ruzzene, M., (2008), "Homogenization and Equivalent in-Plane Properties of Two Dimensional Periodic Lattices," International Journal of Solid and Structures, vol. 45, no. pp. 2897-915]. In-plane mechanical properties with different cell types—square, hexagonal, triangle, mixed squares and triangles, diamond—were investigated by Wang and McDowell [Wang, A. J. and Mcdowell, D. L., (2004), "In-Plane Stiffness and Yield Strength of Periodic Metal Honeycombs," Transactions of the ASME Journal of Engineering Materials and Technology, vol. 126, no. pp. 137-56]. Circular and chiral shapes of honeycombs have also been studied for a functional design [Chung, J. and Wass, A. M., (1999), "Compressive Response and Failure of Circular Cell Polycarbonate Honeycombs under in-Plane Uniaxial Stresses," Transactions of the ASME Journal of Engineering Materials and Technology, vol. 121, no. pp. 494-502; Papka, S. and Kyriakides, S., (1998), "In-Plane Crushing of a Polycarbonate Honeycomb," International Journal of Solid and Structures, vol. 35, no. pp. 239-67; Scarpa, F., Blain, S., Perrott, D., Ruzzene, M., and Yates, J. R., (2007), "Elastic Buckling of Hexagonal Chiral Cell Honeycombs," Composites Part A, vol. 38, no. pp. 280-9]. A multifunctional approach requiring structural stability and fast heat transfer was investigated with honeycomb structures [Torquato, S., Gibiansky, L. V., Silva, M. J., and Gibson, L. J., (1998), "Effective Mechanical and Transport Properties of Cellular Solids," International Journal of Mechanical Science, vol. 40, no. 1, pp. 71-82].

Compared to the fundamental studies on cellular solids, their practical applications have been limited to the development of stiff and ultra-light sandwich cores for aircraft and aerospace structures, which are related to the honeycombs' out of plane properties [Gellatry, R. A., Bijlaard, P. P., and Gallaherm, R. H., (1965), "Thermal Stress and Instability of Sandwich Cylinders on Rigid Supports," Journal of Aircraft, vol. 2, no. 1, pp. 44-8; Lin, W., (1996), "The Point Force Response of Sandwich Panels and Its Application to Impact Problems," in 37th Structures, Structural Dynamics, and Materials Conference, AIAA/ASME/ASCE/AHS/ASC, Salt Lake City, Utah April; Becker, W., (2000), "Closed-Form Analysis of the Thickness Effect of Regular Honeycomb Core Material," Composite Structures, vol. 48, no. pp. 67-70; Kapania, R. K., Soliman, H. E., Vasudeva, S., Hughes, O., and Makjecha, D. P., (2008), "Static Analysis of Sandwich Panels with Square Honeycomb Core," AIAA Journal vol. 46, no. 3, pp. 627-34; Abdelal, G. F. and Atef, A., (2008), "Thermal Fatigue Analysis of Solar Panel Structure for Micro-Satellite Applications," International Journal of Mechanics and Materials in Design, vol. 4, no. pp. 53-62], and rigidified inflatable structure for housing [Khire, R. A., Dessel, S. V., Messac, A., and Mullur, A. A., (2006), "Study of a Honeycomb-Type Rigidified Inflatable Structure for Housing," Journal of Structural Engineering, vol. 132, no. 10, pp. 1664-72]. Recently, honeycombs' in-plane flexibility began to be designed in aerospace morphing technology [Olympio, K. R. and Gandhi, F., (2007), "Zero-Nu Cellular Honeycomb Flexible Skins for One-Dimensional Wing Morphing," in 48th Structures, Structural Dynamics, and Materials Conference, AIAA/ASME/ASCE/AHS/ASC, Honolulu, Hi. April 23-26; Bubert, E. A., Woods, B. K. S., Kothera, C. S., and Wereley, N. M., (2008), "Design and Fabrication of a Passive 1d Morphing Aircraft Skin," in 49th Structures, Structural Dynamics, and Materials Conference, AIAA/ASME/ASCE/AHS/ASC, Schaumburg, Ill. April 7-10]. However, only limited practical studies on design with honeycomb configurations are available; for example, Seepersad et al. carried out a multifunctional design—structural and thermal in the application of gas turbine engines [Seepersad, C. C., Allen, J. K., Mcdowell, D. L., and Mistree, F., (2008), "Multifunctional Topology Design of Cellular Material Structures," Journal of Mechanical Design, vol. 130, no. pp. 031404-13]. Huang and Gibson studied on the design of honeycombs for beam and plate structures [Huang, J. S. and Gibson, L. J., (1999), "Microstructural Design of Cellular Materials-l: Honeycomb Beams and Plates," Acta Metallurgica et Materialia, vol. 43, no. pp. 1643-50]. The in-plane flexible design of honeycombs should be intensively studied for more structural functional applications.

Cellular materials are being considered to replace conventional materials such as polyurethane due to their lower densities, higher efficiencies under cyclic loading conditions, and their ability to be designed with specific mechanical properties. To be successful, the cellular material must have effective shear properties equaling those of polyurethane while reducing the affects of hysteretic energy loss. The material needs to have an effective shear modulus of between 4 and 4.5 MPa and must be able to withstand shear strains up to 10% before yielding occurs in the material. Additionally, the material needs to have an overall height of 12.7 mm and a length of 250 mm.

This application introduces a novel method for the design of honeycomb cellular structures to achieve two target effective properties simultaneously. In the design of honeycomb meso-structures, the conventional geometric parameters (cell height, h, cell length, l, and cell angle, $\theta$) have been used to find effective properties of honeycomb structures. However, the use of these parameters can be cumbersome when designing for two effective properties at the same time. This paper introduces a new system for describing honeycomb structures which focuses on the geometric features of honeycombs which contribute to effective shear properties rather than direct geometric values.

SUMMARY OF THE EXEMPLARY EMBODIMENTS

The present invention includes a method for designing a tire that has a shear layer comprises the following steps for optimizing the shear layer when the wall thickness, t, and vertical layers, $N_v$, of the honeycomb structure are held constant and $G_{12}^*$ and $(\gamma_{12}^*)_{max}$ are designed for in two steps.

First, d, which is the ratio of the length, L, of the honeycomb structure to the number of horizontal layers or cells, $N_h$, is temporarily fixed and a value for R, which is a ratio of the summation of the vertical member lengths, H', relative to the overall height, H, is found to give the target value of $(\gamma_{12}^*)_{max}$.

In the second step, the value of R found in step 1 is held constant and a value for d is found giving the target value of $G_{12}^*$. Because d does not significantly affect $(\gamma_{12}^*)_{max}$ changes to d in step 2 will not alter the value of $(\gamma_{12}^*)_{max}$ designed for in step 1 significantly.

Another possible step is choosing a value for d so that $N_h$ as calculated by L/d is an integer so that the honeycomb structure has the desired dimensions.

The present invention further includes a design method that includes a honeycomb design algorithm. The inputs for the program are the constituent material properties, the design space height, H, the design space length, L, the target range for $(\gamma_{12}^*)_{max}$, and the target value for $G_{12}^*$. For each combination, values for R and $N_h$ are found to produce the desired effective properties in two steps. In the first step, $N_h$ is fixed to an initial value, $N_{h1}$, and a bisection loop is used to find a value of R that will produce $(\gamma_{12}^*)_{max}$ within the specified range. The value of $N_{h1}$ used in this step is found using the following equation: $N_{h1}=2L/H$, which sets d to be approximately equal to H/2 while ensuring that $N_{h1}$ is an integer.

In the second step of the algorithm, the value of R found in step one is held constant and a final value for $N_h$, $N_{hf}$, is found to give the target $G_{12}^*$ shown in the equation below as $(G_{12}^*)_{targ}$. The effective shear stiffness corresponding to $N_{h1}$, $(G_{12}^*)_1$, is known from step one and a second data point is needed to use the linear relationship between $N_h$ and $G_{12}^*$ to find $N_{hf}$. The second data point uses $N_{h2}=2\,N_{h1}$ and finds a corresponding effective shear stiffness, $(G_{12}^*)_2$. $N_{hf}$ is solved for by using the following equation:

$$N_{hf} = \left[ N_{h1} + \left( \frac{(G_{12}^*)_{targ} - (G_{12}^*)_1}{(G_{12}^*)_2 - (G_{12}^*)_1} \right)(N_{h2} - N_{h1}) \right] \quad (10)$$

Once R and $N_{hf}$ are found, the initial values for $N_v$ and t are changed and the process starts over for the new combination of $N_v$ and t. When the algorithm is complete, the resulting structures for each topology combination are reported along with their effective properties.

The present invention also encompasses a tire that uses a shear layer that includes a honeycomb structure that has been designed using either method described above.

Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which:

FIG. 17A shows 10 unit cells of the final structure design without shear while

DETAILED DESCRIPTION OF THE REPRESENTATIVE EMBODIMENTS

In the new system, conventional parameters are replaced by two new parameters, R and d, where R describes the effective height of the vertical honeycomb members relative to the overall height of the structure and d is the horizontal separation between honeycomb cells. The basis for the development of this new system is an assumption that most deformation in honeycomb structures under a shear load is due to bending in the vertical members. When looking at structures as a whole, it is advantageous when designing for shear applications to specify the effective length of vertical members connecting the bottom and top boundaries of the material and the horizontal density of these members rather than the specific lengths and angles of individual members.

One additional benefit of the new system is that it allows for the design space volume of the material to be easily normalized. The new parameters are coupled to the overall dimensions of the material but decoupled from each other, allowing the independent features to be freely modified without changing the macro dimensions of the material.

The independent honeycomb features are investigated to determine the affects each has on effective shear properties. Based on these findings, a new design method for honeycomb mesostructures is developed which takes advantage of independent honeycomb features to design for the two effective properties simultaneously.

Reference will now be made in detail to embodiments of the invention, one or more examples of which are illustrated in the Figures. Each example is provided by way of explanation of the invention, and not meant as a limitation of the invention. For example, features illustrated or described as part of one embodiment can be used with another embodiment to yield still a third embodiment. It is intended that the present invention include these and other modifications and variations. It should be noted that for the purposes of discussion, only half of the exemplary tire embodiments may be depicted in one or more of the figures. Reference numbers are used in the Figures solely to aid the reader in identifying the various elements and are not intended to introduce any limiting distinctions among the embodiments. Common or similar numbering for one embodiment indicates a similar element in the other embodiments. One of ordinary skill in the art, using the teachings disclosed herein, will understand that the same or substantially similar features are repeated on both sides of the tire.

DETAILED DESCRIPTION

Introduction

Cellular materials, for the purposes of this application, are materials constructed from an array of two dimensional, regularly patterned structures called mesostructures. These structures form the body of the material and are bounded by upper and lower membranes. As a whole, these cellular materials act as a single homogeneous material possessing effective mechanical properties which differ from the properties of the constituent material. The effective properties are a result of the mechanics of the system of mesostructures within the material. The objective in cellular material design is to develop a material which has effective properties desired for a particular application.

Honeycomb Cellular Materials

Figure 1:
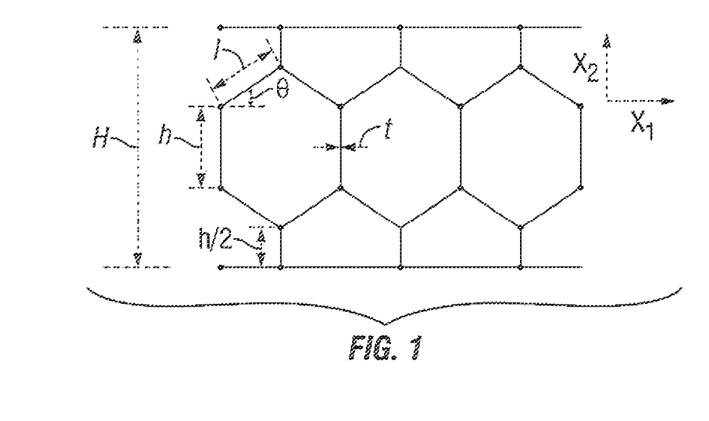
FIG. 1 shows Conventional parameters for a two-dimensional honeycomb structure.

Honeycomb cellular materials are constructed from a regular pattern of hexagonal cells. The cells are oriented so that two of the hexagonal edges are parallel to the X2 direction and the structures attach to the upper and lower membrane boundaries running parallel to the X1 direction (FIG. 1). FIG. 1 shows the conventional parameters used to describe a honeycomb structure with one vertical unit cell.

The analysis of honeycomb materials is performed by considering the structures to be a system of interconnected beams, where the vertical beams have a length h, the angled beams have a length l and the beams have a thickness of t. The effective properties can be derived by observing the reactionary responses of the beam system. The mechanics of the system can be altered by modifying the structural dimensions within the material, resulting in a change in effective properties. By studying how these dimensional modifications influence the effective properties, it is possible to manipulate the structures so that the resulting effective properties reach a target value.

New Parameter Development

The conventional honeycomb parameters have two drawbacks when used for design. Firstly, they are not associated with the overall dimensions of the material, H and L, so that if a single parameter is changed, the overall dimensions will change. Secondly, all geometric parameters are coupled so that all parameters must be altered to comply with a fixed design space, making it difficult to determine the affect of a single parameter on the effective properties. A new system of parameterization was developed to reduce these challenges.

Figure 2:
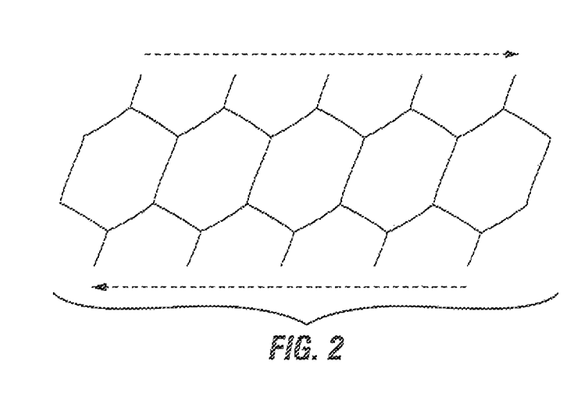
FIG. 2 shows a Honeycomb structure reaction to shear loading.

When a honeycomb structure is subjected to a shear load, the primary mode of deformation is from bending in the vertical members, as shown in FIG. 2. The new system of parameters emphasizes certain attributes of the vertical members relative to the structure as a whole.

In the new system, honeycomb structures are viewed as a series of vertical beams located within the shear layer which are interconnected by relatively rigid angled beams to form the honeycomb pattern. The honeycomb pattern can be divided into vertical layers, where $N_v$ represents the number of vertical layers. From this perspective, two generalizations can be made about the resulting effective properties, $G_{12}^*$ and $(\gamma_{12}^*)_{max}$. First, there are two features of the structure which contribute to $G_{12}^*$, the stiffness of the deformed vertical members, and the horizontal density of the vertical members, and second, only one feature significantly influences $(\gamma_{12}^*)_{max}$, the compliance of the vertical members.

For a constant wall thickness, t, an increase in length of the vertical members will result in a decrease in the member stiffness, decreasing $G_{12}^*$, and an increase in the member compliance, increasing $(\gamma_{12}^*)_{max}$. In the new system of parameters the lengths of the vertical members are described using the effective height, R, which is a ratio of the summation of the vertical member lengths, H', relative to the overall height, H. The vertical members of the honeycomb structure are the members extending along a generally vertical direction, or when applied to the shear band of the tire, the term vertical member as used herein refers to the members extending along a generally radial direction.

$$R = H'/H \tag{1}$$

R is independent of the number of vertical layers, $N_v$, so as $N_v$ increases, the individual heights of the vertical members will decrease, but the combined height will remain constant. Additionally, R is limited to $0<R<2$ to prevent zero vertical member heights at $R=0$ and cell overlap at $R=2$.

For a constant wall thickness, t, and constant vertical member heights, an increase in the horizontal density will require more horizontal cells, $N_h$, to be deformed over a given length of the material, resulting in an increase of $G_{12}^*$. The horizontal density of the vertical members is determined in the new system by the horizontal separation, d, of the horizontal cells.

$$d = L/N_h \quad (2)$$

Figure 3:
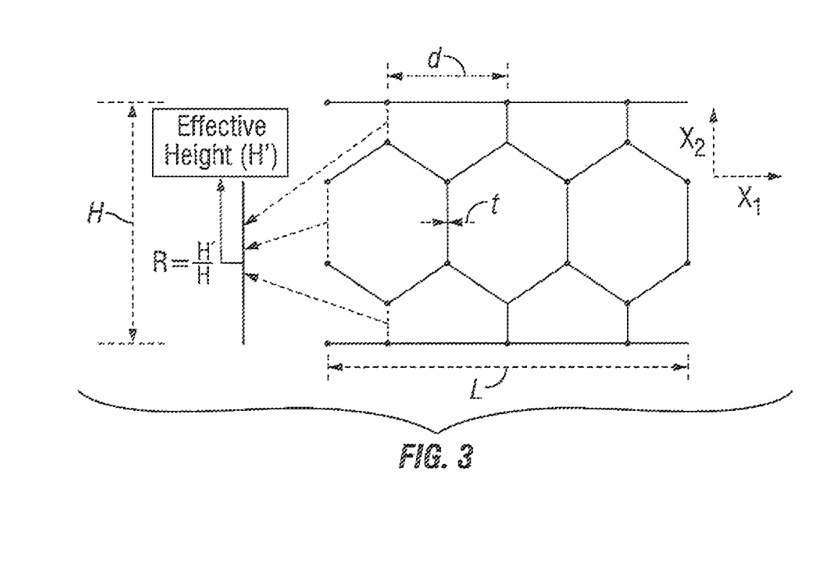
FIG. 3 illustrates a Honeycomb structure using the new system of parameters for $N_v=1$ and $N_h=3$.

Because the new parameters are independent of each other but dependent of one dimension of the design space, R and d can be modified independently without affecting each other or the overall dimensions of the material. FIG. 3 shows the new parameterized system, and the conversion equations relating the new and conventional parameters are given in equations 3 through 5.

$$R = \frac{2hN_v}{H} \quad (3)$$

$$d = 2l \cdot \cos\theta \quad (4)$$

$$\text{Where } \theta = \tan^{-1}\left(\frac{H(1-R)}{d \cdot N_v}\right) \quad (5)$$

Analysis

Parametric studies were performed on the new parameters to determine their affects on $G_{12}^*$ and $(\gamma_{12}^*)_{max}$. The studies were performed using a Matlab program which works in concert with Abaqus FEA. The honeycomb structures are generated and modified in Matlab and Abaqus is used for analysis. The material used in the analysis was polycarbonate which has a modulus of elasticity of 2.7 GPa, Poisson's ratio of 0.42, and a yield stress of 81 MPa.

For each analysis step, the structures were subjected to simple shear and the desired results were the shear stiffness, $G_{12}^*$, and the maximum allowable shear strain, $(\gamma_{12}^*)_{max}$. The structures were modeled using quadratic beam elements and the material was modeled as elastic. For each structure, a single static analysis step was performed.

Figure 4:
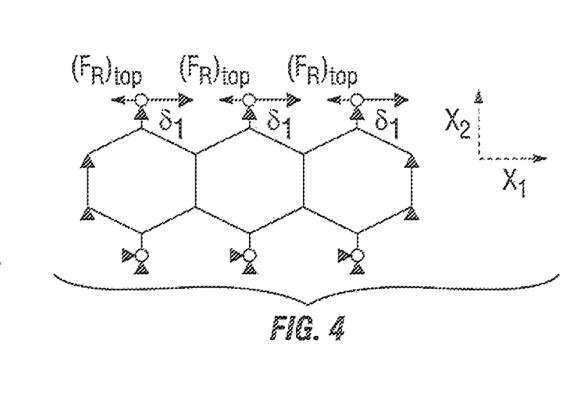
FIG. 4 depicts the Boundary conditions used for analysis.

To simulate simple shear, the bottom legs were fully constrained at the base and the bases of the top legs were subjected to a displacement in the X1 direction and constrained to allow for no rotation or X2 displacement. Additionally, the vertices at the left and right ends of the structure were constrained in the X2 direction to minimize the end affects. FIG. 4 gives a schematic of the boundary conditions.

The shear stiffness, $G_{12}^*$, was calculated using the reaction force method. The sum of the reaction forces, $(F_R)_{top}$, at the locations of the displacement boundary conditions, $\delta_1$, were used with the top surface area to find the effective shear stress, $\tau^*$. In equation 6, the top surface area is the total length of the structure, L, by the depth of the structure normal to the 2-D structure, b. The effective shear strain, $\gamma^*$, is known from the displacement of the top nodes.

$$\tau^* = \frac{\sum(F_R)_{top}}{bL} \quad (6)$$

$$\gamma^* = \frac{\delta}{H} \quad (7)$$

The maximum allowable shear strain was calculated using Von Mises stress results. In the elastic range of the material, the linear stress strain relationship was used to calculate $(\gamma_{12}^*)_{max}$ using equation 8, $$(\gamma_{12}^*)_{max} = \frac{\sigma_Y \gamma_{12}^*}{(\sigma_{vm})_{max}} \quad (8)$$

Where $\gamma_{12}^*$ is the effective shear strain used in the analysis, $\sigma_Y$ is the yield strength of a material, and $(\sigma_{vm})_{max}$ is the maximum Von Mises stress found in the finite element analysis.

The parametric studies for R and d were performed for both the one and two vertical cell configurations. For each configuration, R is varied from 0.4 to 1.8 in increments of 0.2, and d is varied from 4 mm to 10 mm in increments of 3 mm. The parametric studies for the conventional system of parameters, h, l, and θ, were performed for only the single vertical cell configuration. The value of h is varied from 4.0 mm to 11.5 mm with l values of 3 mm, 4.5 mm, and 7 mm.

New Parameter Results

Effective Shear Stiffness

Figure 5:
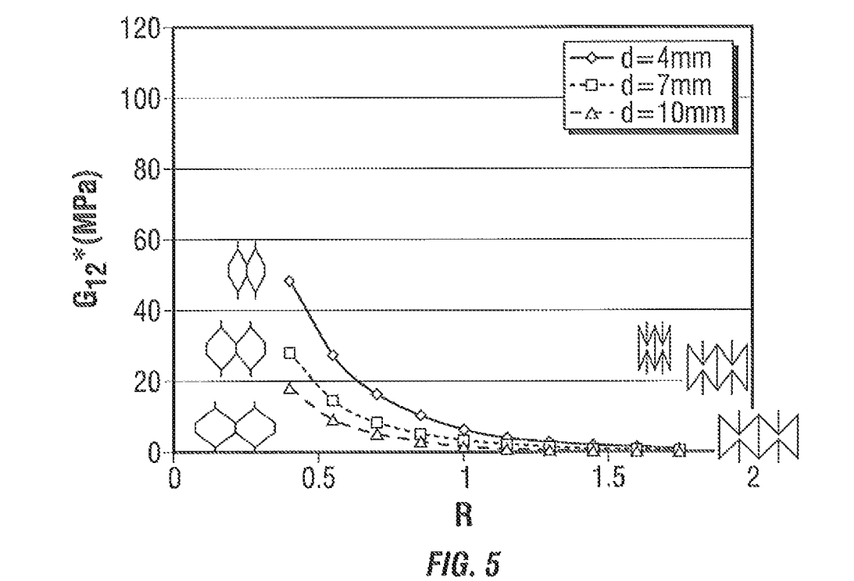
FIG. 5 is a graph showing the Affects of R and d on $G_{12}^*$ (H=12.7 mm t=0.5 mm, $N_v=1$).
Figure 6:
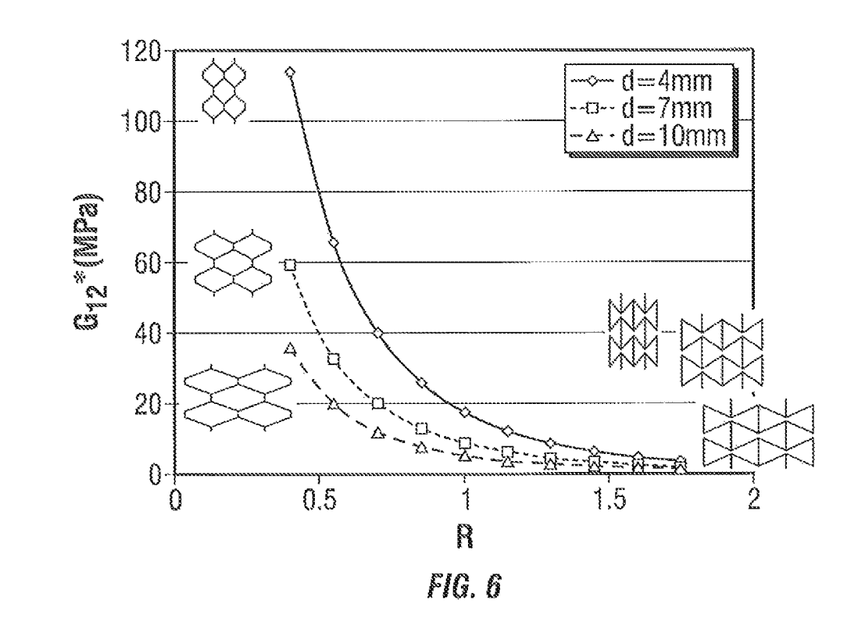
FIG. 6 has graphs showing the Affects of R and d on $G_{12}^*$ (H=12.7 mm t=0.5 mm, $N_v=2$).

The test results show that an increase in effective height, R, and an increase in horizontal separation, d, both cause a decrease in $G_{12}^*$. As R increases from 0.4 to 1.8, the increasing lengths of the deformed vertical beams cause them to become less stiff, resulting in a decrease to $G_{12}^*$. When d is increased from 4 to 10 mm, the horizontal density of the deformed vertical members decreases and fewer members must be deformed over a given length, resulting in a decrease in $G_{12}^*$. The results are shown in FIGS. 5 and 6.

The number of vertical cell layers, $N_v$, also influences $G_{12}^*$. The same values for R and d were used in FIG. 5 and FIG. 6, however $G_{12}^*$ is significantly greater in FIG. 6 when $N_v=2$. Although the effective heights of the vertical members are equal, when $N_v$ is increased the effective vertical member length is more constrained, causing the structure to become more stiff.

Maximum Effective Shear Strain

Figure 7:
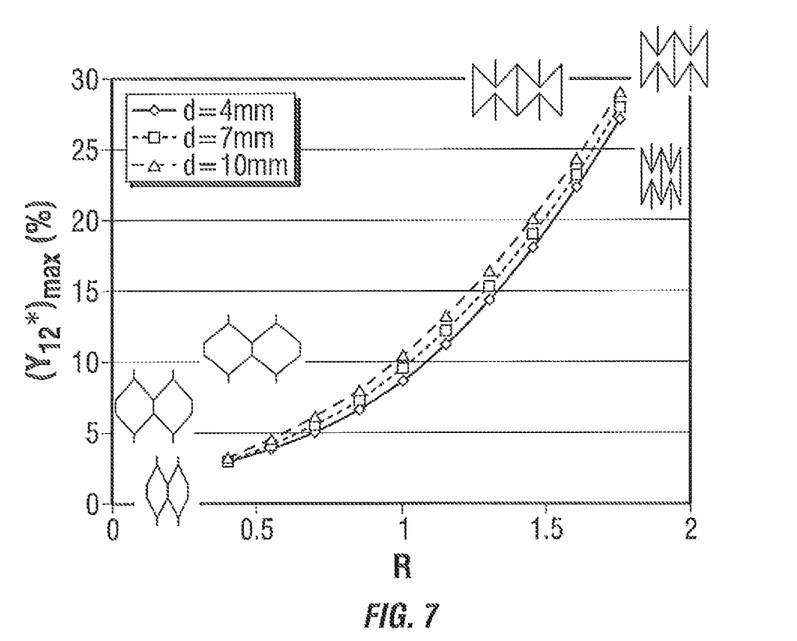
FIG. 7 has graphs showing the Affects of R and d on $(\gamma_{12}^*)_{max}$ (H=12.7 mm t=0.5 mm, $N_v=1$).
Figure 8:
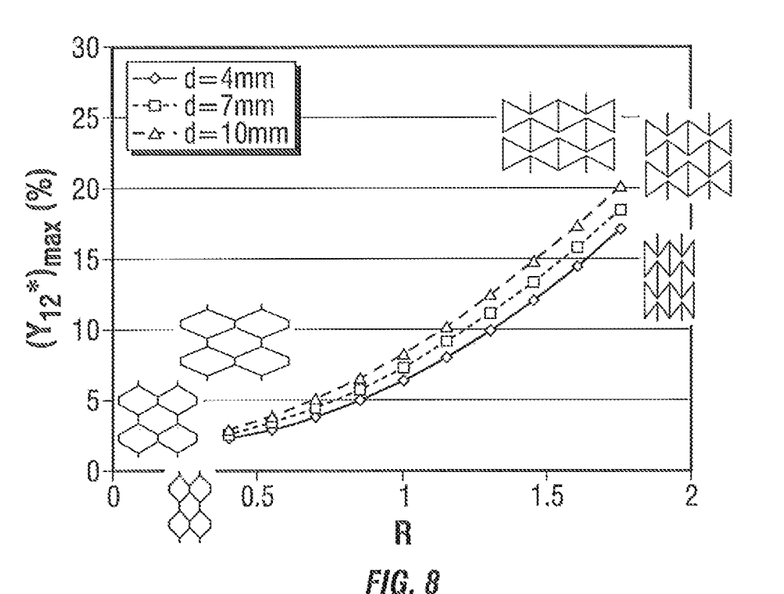
FIG. 8 contains graphs showing the Affects of R and d on $(\gamma_{12}^*)_{max}$ (H=12.7 mm t=0.5 mm, $N_v=2$).

The test results show that the maximum effective shear strain, $(\gamma_{12}^*)_{max}$, increases as R is increased. This again is attributed to the increased length of the deformed vertical beams within the structure. As R increases, the vertical lengths increase and are able to permit larger deformations before yielding occurs. The results are shown in FIGS. 7 and 8.

The results also show that changes to horizontal separation, d, result in an increase in $(\gamma_{12}^*)_{max}$. However, the increase in $(\gamma_{12}^*)_{max}$ due to d is low compared with R. Because R and d are decoupled, and R designates the lengths of the vertical members, changes in d do not alter the dimensions of the individual vertical members. Therefore, the deformed vertical members will begin to yield at approximately the same level of strain regardless of the horizontal separation.

Conventional Parameter Results

Figure 9:
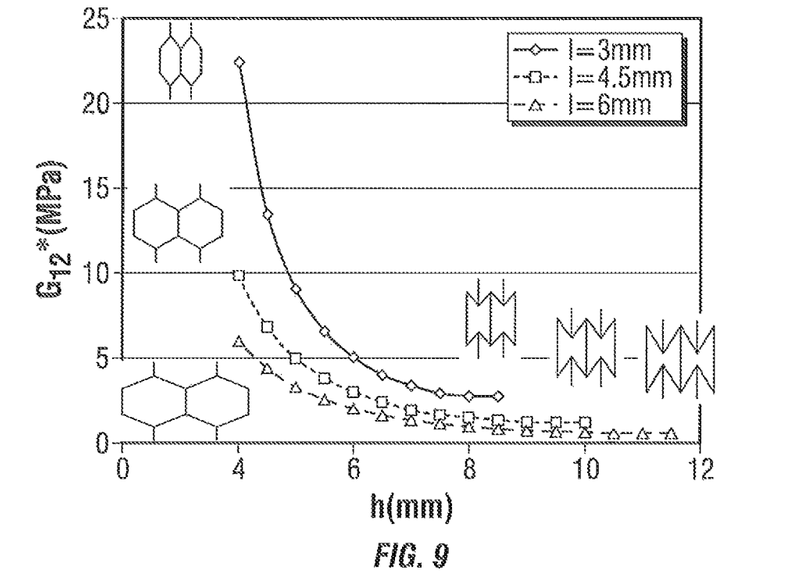
FIG. 9 contains graphs showing the Affects of h and l on $(\gamma_{12}^*)_{max}$ (H=12.7 mm t=0.5 mm, $N_v=1$).
Figure 10:
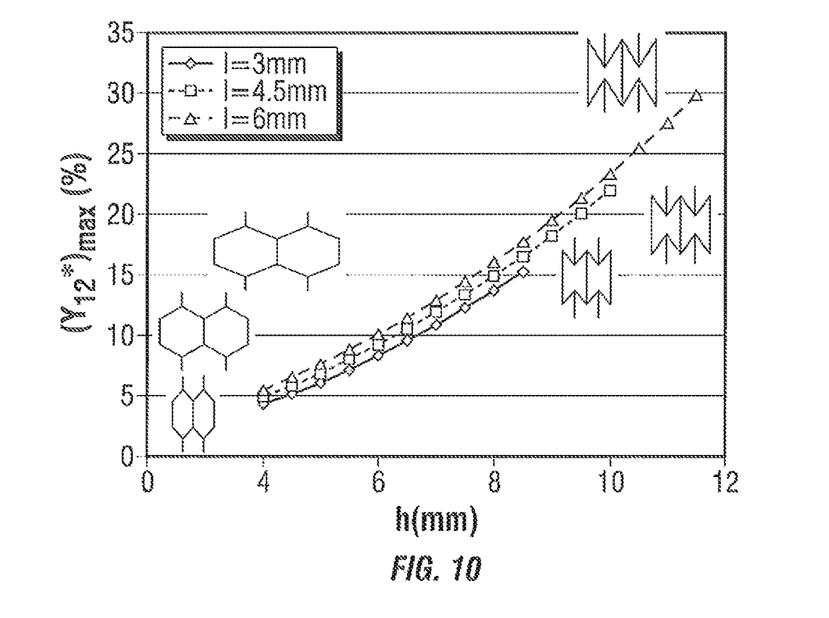
FIG. 10 has graphs showing the Affects of h and l on $(\gamma_{12}^*)_{max}$ (H=12.7 mm t=0.5 mm, $N_v=1$).
Figure 11A:
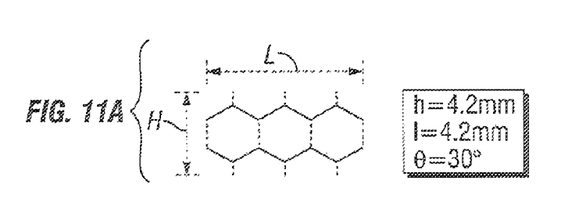
FIGS. 11A thru D are Illustrations of the parameter modifications required to comply with a given design space when h is changed from 4.2 to 7.0 mm using the traditional system.
Figure 11B:
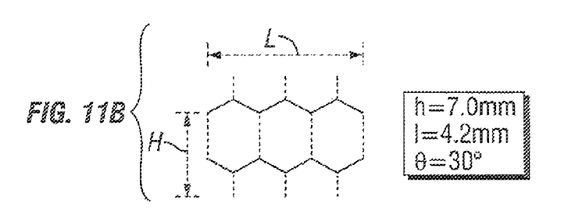
Figure 11C:
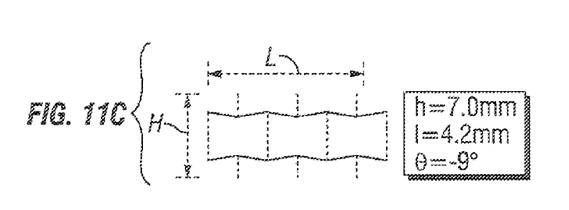
Figure 11D:
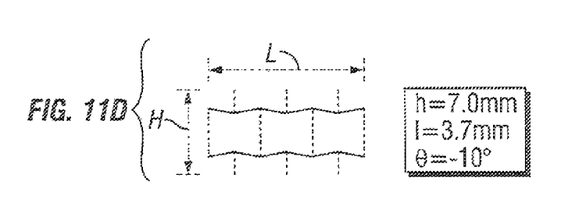

The results for the conventional geometric parameters, h and l, are shown in FIG. 9 and FIG. 10. The results for effective shear stiffness in FIG. 9 show that an increase in l causes $G_{12}^*$ to decrease and an increase in h generally causes $G_{12}^*$ to decrease. The results for maximum effective shear strain in FIG. 10 show that an increase in h will cause an increase in $(\gamma_{12}^*)_{max}$ and that an increase in l causes only a small increase in $(\gamma_{12}^*)_{max}$.

Parameter Systems Comparisons

Either system can be used to design a honeycomb material having both a target effective shear stiffness and maximum effective shear strain. However, the new system has several advantages over the conventional system which can improve the efficiency of the design process.

Design Space Constraints

When designing a cellular material for any application, the resulting material must comply with a specified volume of space. In the case of honeycomb structures, designing for a specific volume can be difficult using the conventional parameters because they are not related to the design space dimensions. With a set design space, when one parameter is changed, the others must also be modified to maintain a constant volume.

In FIG. 11 a hypothetical design space is set at H=12.7 mm and L=22 mm and the structures needs to be modified so that h increases from 4.2 to 7 mm. In FIG. 11A, the structure complies with the design space with h=4.2 mm, l=4.2 mm, and θ=30. When h is increased from 4.2 to 7 mm in FIG. 11B the overall height of the structure is greater than the design space height. To reduce the height to equal the design space height, θ is decreased from 30 degrees to −9 degrees in FIG. 11C. However, this causes the overall length to increase beyond the design space length, L. FIG. 11D shows the final structure having h=7 mm which complies with the design space after all parameters are adjusted.

The new system of parameters eliminates this complication by associating each new parameter to the overall design space, where R is related to the overall height by R=H'/H, and d is related to the total length by d=L/$N_h$. Because of these relations, the parameters can be changed without altering the overall dimensions of the material. Additionally, the two new parameters are fully independent of each other, allowing for one parameter to be fixed while the other is altered, as illustrated in FIG. 12.

Figure 12:
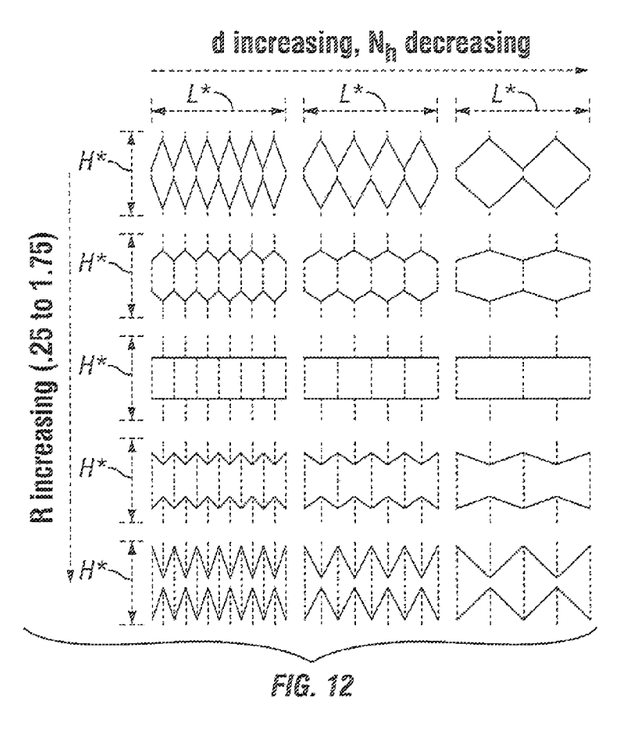
FIG. 12 is an Illustration of how modifications to R and d affect the structure.

For all of the structures shown in FIG. 12, the design space height, H, and length, L, are held constant. Moving from top to bottom, the effective height, R, is increased, causing the lengths of the vertical members to increase while maintaining a constant overall height, H. Moving from left to right, the horizontal separation, d, is increased and the number of horizontal cells is decreased according to equation 2 to comply with the overall design space.

Parameter-Property Relations

In the conventional parametric studies discussed above, in order to maintain a constant value for l as h increases, θ must change to maintain a constant overall height, H. An affect of the changing θ is that the length of the structure will be altered as h increases. As a result, the parameter-property relations in FIG. 9 and FIG. 10 are found using a structure with a continually changing volume.

In the parametric study results for the new system, the structural volume is constant as R increases when d is fixed. As a result, the parameter-property relationships are representative of structures with equal volume, making the new system advantageous when designing for a specific volume of space.

Design Method

Figure 13:
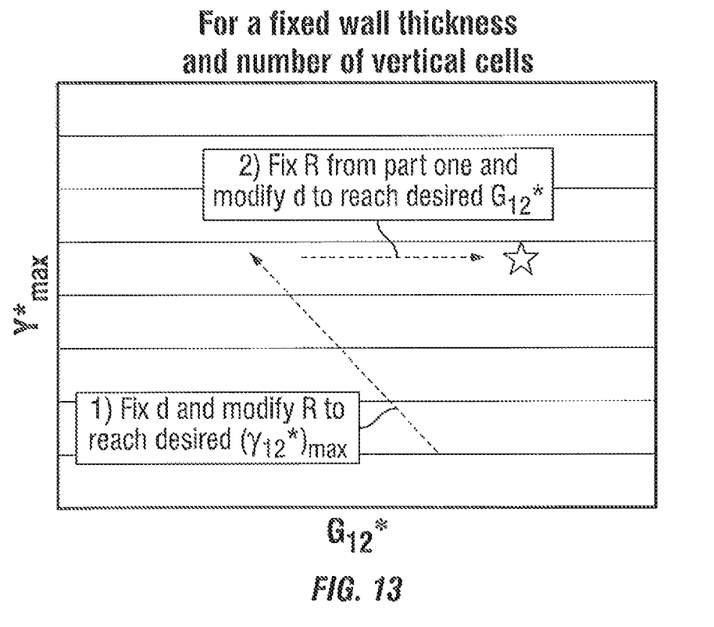
FIG. 13 is a Schematic of the new design method.

In the new system of parameters, when the wall thickness, t, and vertical layers, $N_v$, are held constant, only one of the remaining design variables, R, significantly affects $(\gamma_{12}^*)_{max}$. This aspect is used in a new design method to design for both G12* and $(\gamma_{12}^*)_{max}$ at the same time. In this method, t and $N_v$ are fixed and $G_{12}^*$ and $(\gamma_{12}^*)_{max}$ are designed for in two steps. In the first step, d is temporarily fixed and a value for R is found to give the target value of $(\gamma_{12}^*)_{max}$. In the second step, the value of R found in step 1 is held constant and a value for d is found giving the target value of $G_{12}^*$. Because d does not significantly affect $(\gamma_{12}^*)_{max}$, changes to d in step 2 will not alter the value of $(\gamma_{12}^*)_{max}$ designed for in step 1 significantly. FIG. 13 illustrates how both effective properties are designed for using this method.

Affects of $N_h$ on $G_{12}^*$

Figure 14:
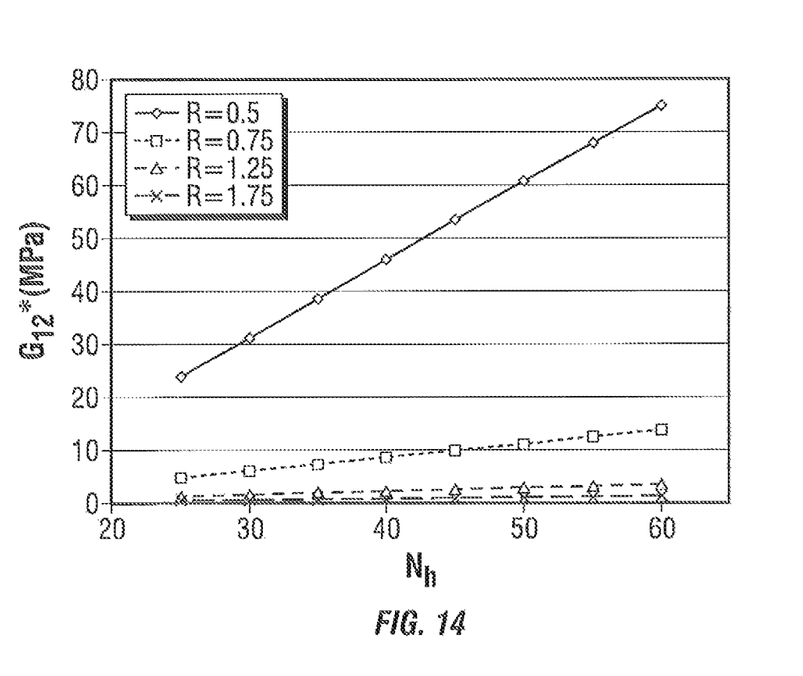
FIG. 14 is a graph showing the Affects of $N_h$ on $G_{12}^*$ when L and R are constant.

To design the structure to comply with the design space length, the values for d must be chosen so that $N_h$ in equation 2 is an integer. In the second step of the design process when R is fixed, it is beneficial to use L and integer values for $N_h$ to design for d to ensure that the resulting structures have the desired dimensions. In FIG. 14, the design length, L, is fixed and $G_{12}^*$ is plotted as $N_h$ increases. The results show that for a fixed L and R, $G_{12}^*$ will increase linearly as the number of horizontal cells increase. To more efficiently design d, this linear relationship can be used to find a value for $N_h$ giving the target $G_{12}^*$ and d can be calculated using equation 2.

Honeycomb Design Algorithm

Figure 15:
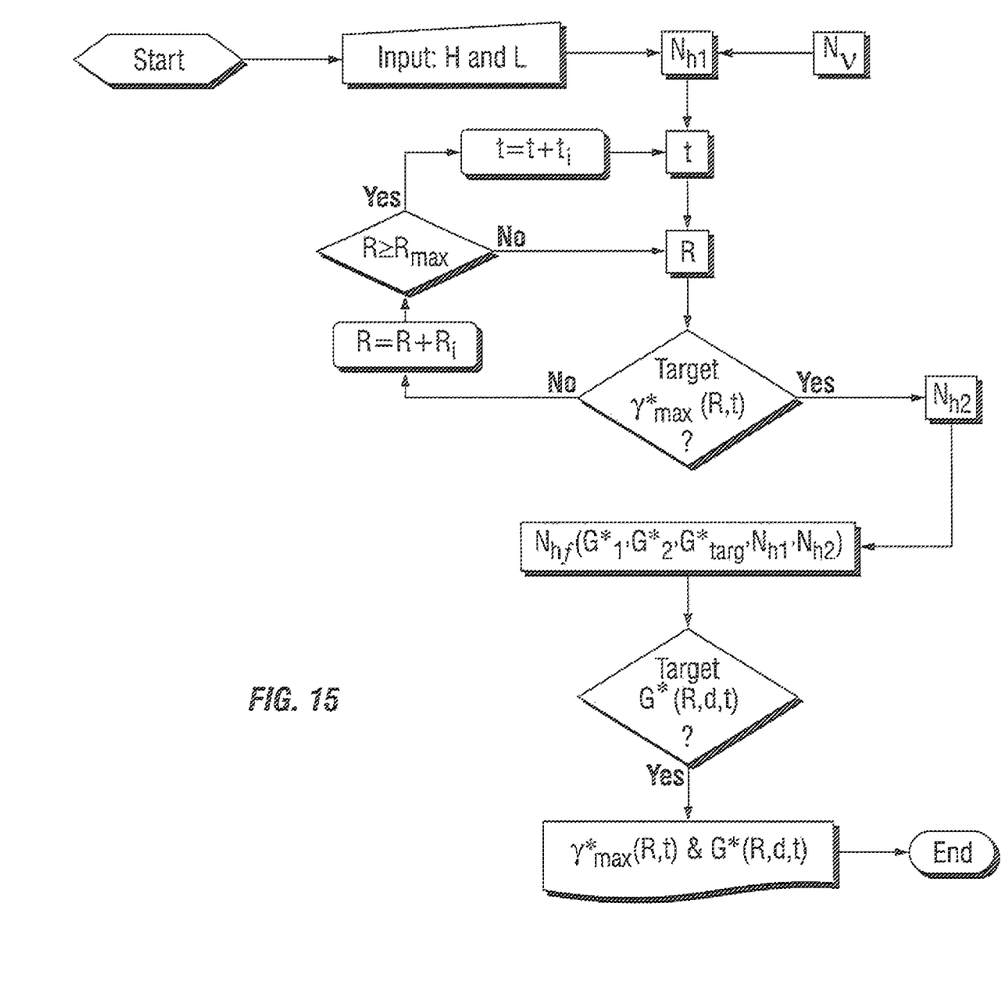
FIG. 15 is a Honeycomb design algorithm flow chart.

A honeycomb design algorithm was developed using the new design method to aid in the design process. The inputs for the program are the constituent material properties, the design space height, H, the design space length, L, the target range for $(\gamma_{12}^*)_{max}$, and the target value for $G_{12}^*$. FIG. 15 shows a schematic of the algorithm. The algorithm starts with multiple combinations of cell wall thickness, t, and vertical cell layers, $N_v$. For each combination, values for R and $N_h$ are found to produce the desired effective properties in two steps. In the first step, $N_h$ is fixed to an initial value, $N_{h1}$, and a bisection loop is used to find a value of R that will produce $(\gamma_{12}^*)_{max}$ max within the specified range. The value of $N_{h1}$ used in this step is found using equation 9, which sets d to be approximately equal to H/2 while ensuring that $N_{h1}$ is an integer.

$$N_{h1} = \left[\frac{2L}{H}\right] \tag{9}$$

In the second step of the algorithm, the value of R found in step one is held constant and a final value for $N_h$, $N_{hf}$ is found to give the target $G_{12}^*$ shown in the equation below as $(G_{12}^*)_{targ}$. The effective shear stiffness corresponding to $N_{h1}$, $(G_{12}^*)_1$, is known from step one and a second data point is needed to use the linear relationship between $N_h$ and $G_{12}^*$ to find $N_{hf}$. The second data point uses $N_{h2}=2 N_{h1}$ and finds a corresponding effective shear stiffness, $(G_{12}^*)_2$. Equation 10 is then used to solve for $N_{hf}$.

$$N_{hf} = \left[N_{h1} + \left(\frac{(G_{12}^*)_{targ} - (G_{12}^*)_1}{(G_{12}^*)_2 - (G_{12}^*)_1}\right)(N_{h2} - N_{h1})\right] \tag{10}$$

Once R and $N_{hf}$ are found, the initial values for $N_v$ and t are changed and the process starts over for the new combination of $N_v$ and t. When the algorithm is complete, the resulting structures for each topology combination are reported along with their effective properties.

Algorithm Properties

The algorithm was developed to be a generic process for designing honeycomb structures for both shear stiffness and shear compliance within a specific design space. There are, however, some drawbacks to this process which must be considered.

Firstly, the use of beam elements for the analysis requires some precaution when analyzing the final results. Because they do not account for cell wall overlap at the points of connection, structures resulting in low aspect ratios should be further analyzed using non-beam elements. Secondly, although changes to $d(N_h, L)$ do not significantly affect $(\gamma_{12}^*)_{max}$ relative to R, large changes to d in the second step of the algorithm will cause the resulting value of $(\gamma_{12}^*)_{max}$ to $$\frac{\rho^*}{\rho_s} = \frac{t/l(h/l + 2)}{2\cos\theta(h/l + \sin\theta)} \quad (11)$$

Figure 17A:
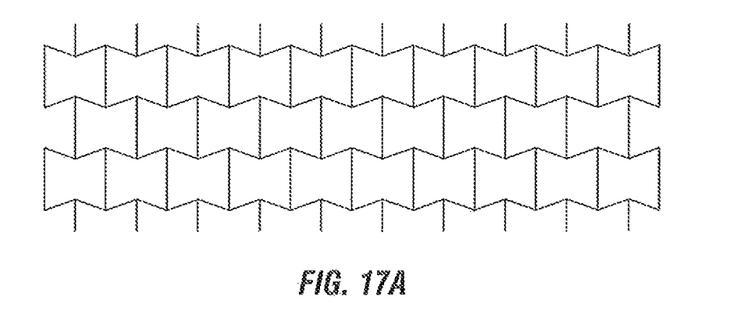
Figure 17B:
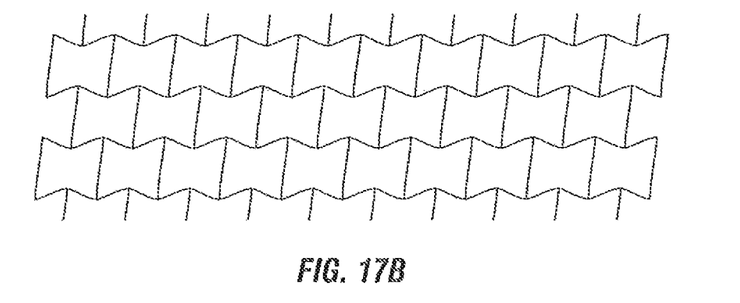
FIG. 17B shows those same unit cells sheared at 10%.

From Table 1, structure 2 has the lowest relative density of 0.31 and is selected as the best candidate for the light weight cellular material. The geometric parameters and the resulting effective properties of the final design are shown in Table 2 and FIG. 17B shows the structure sheared at 10%.

TABLE 2

Geometric parameters and effective properties of the final structure design.

| t (mm) | $N_v$ | $N_h$ | R | d (mm) | h (mm) | I (mm) | θ | $G_{12}^*$ (MPa) | $(V_{12}^*)_{max}$ (%) | $\rho^*/\rho_s$ |
|---|---|---|---|---|---|---|---|---|---|---|
| 0.5 | 2 | 62 | 1.2 | 4.03 | 3.81 | 2.11 | −17.5 | 4.25 | 10.49 | 0.31 | drift from the original value found in step one. This can result in structures having $(\gamma_{12}^*)_{max}$ outside the range specified by the user. In order to decrease the amount of drift, $N_{h1}$ should be chosen so that it is closer to the final value, $N_{hf}$. Finally, because there are no limits placed on $N_{hf}$, the resulting structures can have a very small horizontal separation, d, causing significant cell wall overlap.

Light Weight Component Design

Figure 16A:
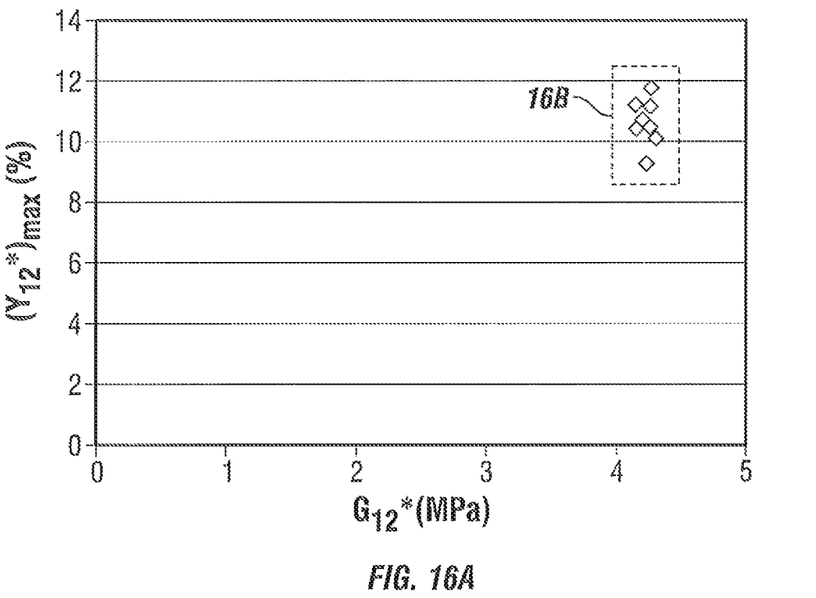
FIGS. 16A and B contain graphs showing the Algorithm results for $G_{12}^*$=4.25 MPa and 10%<$(\gamma_{12}^*)_{max}$<10.5%.
Figure 16B:
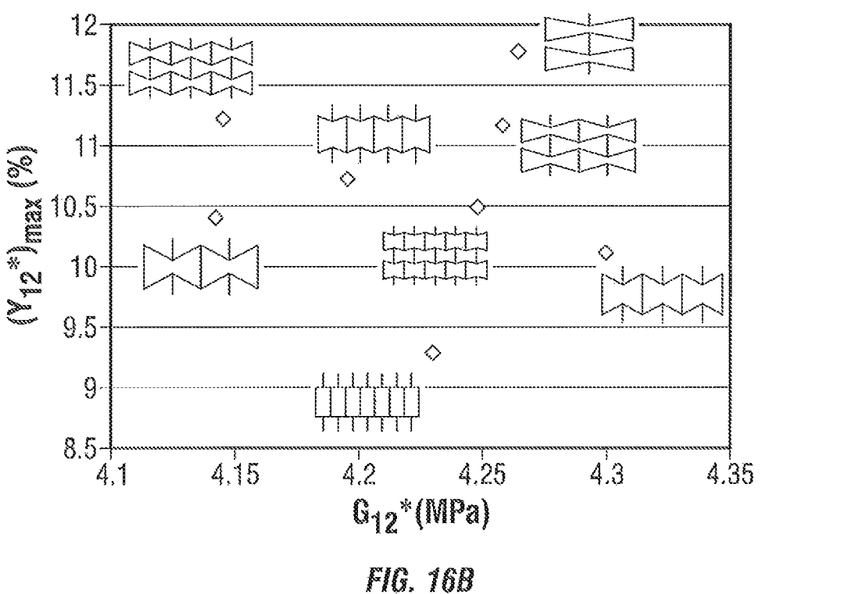

The algorithm was used to design the light weight structure having a design space dimensions of H=12.7 mm and L=250 mm. The target properties for this material are between 4 and 4.5 MPa for $G_{12}^*$, and at least 10% for $(\gamma_{12}^*)_{max}$. The target ranges in the program were set to $G_{12}^*$=4.25 MPa and 10%< $(\gamma_{12}^*)_{max}$<10.5%. The cell wall thicknesses were set to 0.5, 0.75, 1, and 1.25 mm for both the one and two vertical cell configurations. The results of the algorithm are shown in FIGS. 16A and 16B and Table 1.

TABLE 1

Data results from FIG. 16.

| # | t (mm) | $N_v$ | $N_{hf}$ | R | $d_f$ (mm) | $G_{12}^*$ (MPa) | $(T_{12}^*)_{max}$ (%) | $\rho^*/\rho_s$ |
|---|---|---|---|---|---|---|---|---|
| 1 | 0.5 | 1 | 81 | 0.95 | 3.09 | 4.23 | 9.29 | 0.23 |
| 2 | 0.5 | 2 | 62 | 1.20 | 4.03 | 4.25 | 10.49 | 0.31 |
| 3 | 0.75 | 1 | 48 | 1.25 | 5.21 | 4.20 | 10.73 | 0.32 |
| 4 | 0.75 | 2 | 31 | 1.45 | 8.06 | 4.15 | 11.22 | 0.39 |
| 5 | 1 | 1 | 31 | 1.30 | 8.06 | 4.30 | 10.12 | 0.34 |
| 6 | 1 | 2 | 21 | 1.50 | 11.90 | 4.26 | 11.17 | 0.45 |
| 7 | 1.25 | 1 | 20 | 1.43 | 12.50 | 4.14 | 10.41 | 0.36 |
| 8 | 1.25 | 2 | 14 | 1.60 | 17.86 | 4.27 | 11.78 | 0.51 |

Looking at FIG. 16B, all of the structures were able to reach the desired range for $G_{12}^*$, and three are also within the specified range for $(\gamma_{12}^*)_{max}$. The resulting $(\gamma_{12}^*)_{max}$ outside the target are a result of large $(\gamma_{12}^*)_{max}$ drift in the second stage of the algorithm. However, because all but one of the structures are above the minimum required value of $(\gamma_{12}^*)_{max}$>10%, seven of the resulting structures are viable candidates for the light weight material.

The relative density is used to select from the seven viable structures produced. The relative density describes the amount of volume occupied by the structure within the design space and is calculated using equation 11, where $\rho_s$ is the density of the constituent material. The relative densities for all of the structures are given in the final column of Table 1.

Conclusion

A new system of parameterization was developed to increase the efficiency of honeycomb structure design for a target effective shear stiffness and maximum effective shear strain simultaneously. With this system, a designer is able to easily normalize the design space and modify the structure so that the resulting properties change in a predictable way due to the concrete parameter-property relationships. Additionally, the new system successfully decouples one of the design parameters with one of the target properties, simplifying the process of designing for two target properties. Based on the new parameterized system, a new design method was developed to design for the two effective properties simultaneously and an algorithm was created using this method to search for solutions using multiple topologies.

The algorithm was used to search for structures with and effective shear modulus between 4 and 4.5 MPa able to reach an effective shear strain of at least 10%. Of the 8 structures produced by the algorithm, 7 were successful in satisfying the effective property requirements and the structure with the lowest relative density was selected for the final design. The final structure design has an effective shear modulus, $G_{12}^*$, of 4.25 MPa and maximum effective shear strain, $(\gamma_{12}^*)_{max}$, of 10.49% with a relative density of 0.31.

INDUSTRIAL APPLICATIONS

As can be seen, the present invention provides a method for designing a suitable substitute for elastomeric materials such as rubber or polyurethane that are used in shear layer of a tire. Hence, a tire with lower mass, hysteresis and rolling resistance can be designed and manufactured quickly and effectively.

Figure 18:
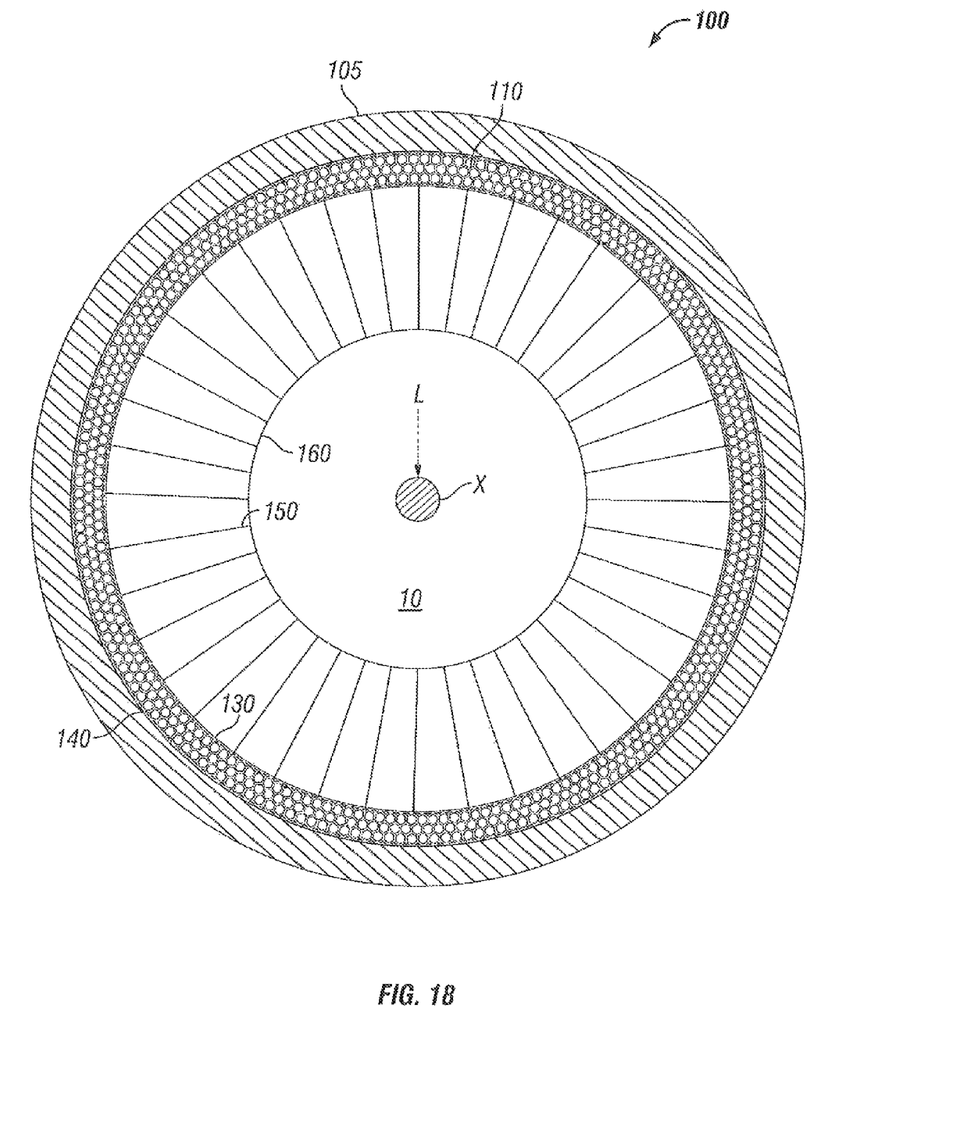
FIG. 18 is a front view of a tire that uses a Shear Layer having a Conventional Honeycomb Configuration with Cells where the Cell Angle θ=60°.
Figure 19:
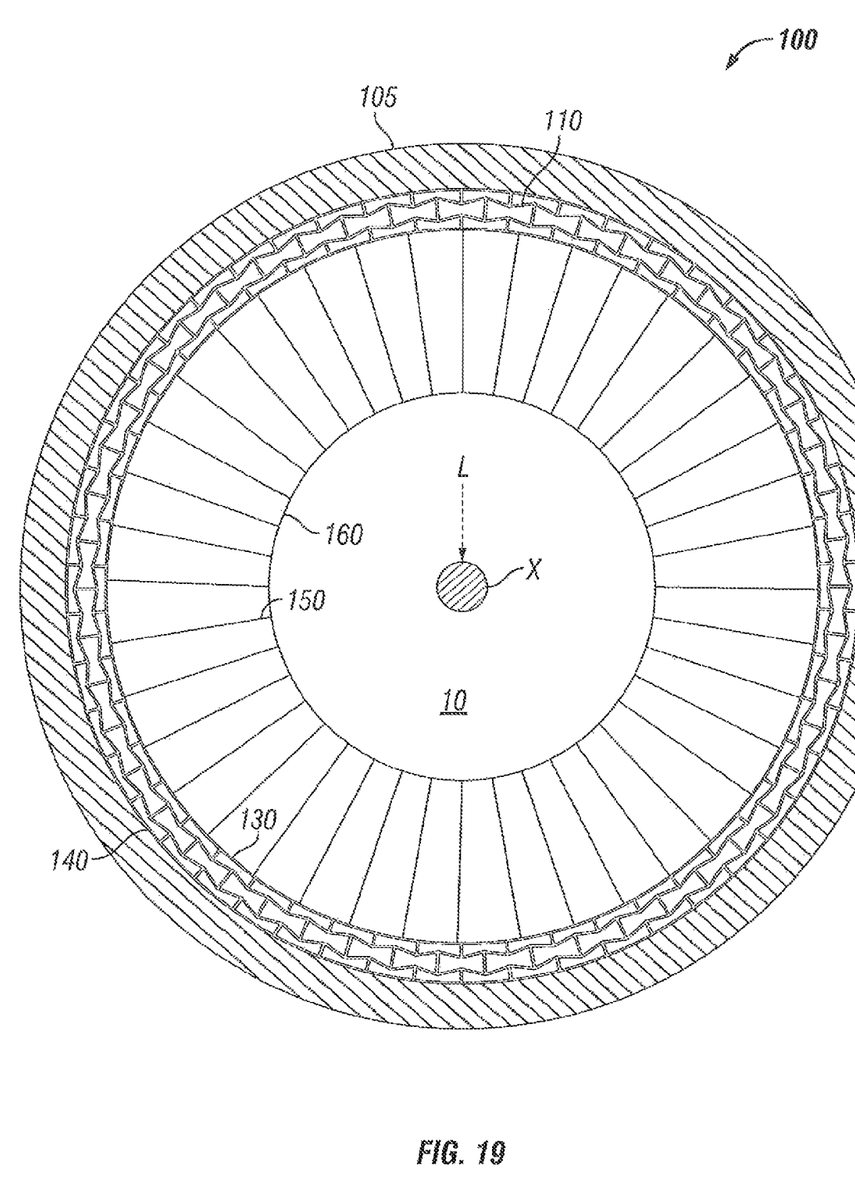
FIG. 19 is a front view of a tire that uses a Shear Layer having an Auxetic Honeycomb Configuration with Cells where the Cell Angle θ=−10°.

Looking at FIG. 18, a tire 100 with a rotational axis X in accordance with the design disclosed by U.S. Pat. No. 7,201,194 is shown having a reinforced annular band 110 that has a shear layer with a conventional honeycomb design. On either side of the shear layer 110 are found inextensible membranes 130, 140. The reinforced annular band 110 is connected to the mounting band 160 by flexible spokes 150. The mounting band 160 in turn connects the tire to a hub or wheel 10. Also, a tread 105 is connected to the outward radial portion of the annular band 110. On the other hand, FIG. 19 shows a tire 100 with a reinforced annular band 110 that has a shear layer with an auxetic honeycomb configuration. When either tire is loaded with a force or load L, the tread and annular band will flatten (not shown) to create a pressure distribution in the contact patch of the tire that is similar to that found in a pneumatic tire that lacks such a shear layer or annular band. While these embodiments are shown using spokes as disclosed by U.S. Pat. No. 7,201,194, it is equally contemplated that the honeycomb structures could be used in embodiments with solid sidewalls such as is disclosed by U.S. Pat. No. 6,769,465. Both shear layers can be designed using the method of the present invention.

It should be understood that the present invention includes various other modifications that can be made to the exemplary embodiments described herein that come within the scope of the appended claims and their equivalents. These and other embodiments of the present invention are with the spirit and scope of the claims which are to follow.

What is claimed is:

1. A computer implemented method for designing a tire, said tire having a shear band that has a desired in-plane effective shear stiffness, $G_{12}^*$, a desired maximum shear strain, $(\gamma_{12}^*)max$, a shear layer, said shear layer having a honeycomb structure having a plurality of vertical members, a summation of lengths of said vertical members, H', an overall height, H, a plurality of horizontal cells, $N_h$, a wall thickness, t, vertical layers, $N_v$, a length of the honeycomb structure, L, a defined variable, d, which is the ratio of said length, L to the number of said plurality of horizontal cells, $N_h$, another defined variable, R, which is the ratio of said summation of lengths of said vertical members, H' relative to said overall height, H, in order to obtain said $G_{12}^*$ and said $(\gamma_{12}^*)max$, the method comprising the following steps:

first, holding constant said wall thickness t and said vertical layers $N_v$ in a computer implemented algorithm, and
second, using the computer implemented algorithm, temporarily fixing d and determining a value of said variable R that provides said desired $(\gamma_{12}^*)max$.

2. The method of claim 1, which further comprises the step of holding constant the value of R and finding a value of d that provides the desired value of $G_{12}^*$.

3. The method of claim 2, which further comprises the step of choosing a value for d so that $N_h$ as calculated by L/d is an integer so that the honeycomb structure has the desired dimensions.

4. A tire that comprises a shear band with a shear layer designed by the method of claim 1.

5. A computer implemented method for design of a shear layer for use in a shear band of a tire, said shear layer having a desired in-plane effective shear stiffness, $G_{12}^*$, a desired maximum shear strain, $(\gamma_{12}^*)max$, said method including the use of a honeycomb design algorithm, said honeycomb having a plurality of vertical members, a summation of a vertical member lengths H', an overall height, H, a plurality of horizontal cells, $N_h$, wall thickness, t, vertical layers, $N_v$, a length of the honeycomb structure, L, a defined variable, d, which is the ratio of said length, L, to said number of horizontal cells, $N_h$, another defined variable R, which is the ratio of the summation of said vertical member lengths, H', relative to said overall height, H, said method comprising the following steps:

first, inputting a one or more constituent material properties, a design value for said height, H, a design value for said length, L, a target range for $(\gamma_{12}^*)max$, and a target value of $G_{12}^*$ into the computer implemented honeycomb design algorithm, and
second, using the computer implemented algorithm to fix the number of horizontal cells, $N_h$, to an initial value $N_{h1}$ and using a bisection loop to find a value of R that will produce a value for $(\gamma_{12}^*)max$ within a specified range, wherein the value of $N_{h1}$ used in this step is found using the equation $N_{h1}=2L/H$, which sets d to be approximately equal to H/2 while ensuring that $N_{h1}$ is an integer.

6. The method of claim 5, which further comprises the step of holding the value of R found in the previous step constant and calculating $N_{hf}$, wherein $N_{h1}$, $N_{h2}$ and $G_{12}^*$ have a linear relationship, using the following equation:

$$N_{hf} = \left[ N_{h1} + \left( \frac{(G_{12}^*)_{targ} - (G_{12}^*)_1}{(G_{12}^*)_2 - (G_{12}^*)_1} \right)(N_{h2} - N_{h1}) \right] \quad (10)$$

wherein the effective shear stiffness corresponding to $N_{h1}$, $G_{12}^*1$, is taken from step two and a second data point $N_{h2}$, which is needed to use said linear relationship between $N_{h1}$, $N_{h2}$ and $G_{12}^*$ to find $N_{hf}$ is calculated by doubling $N_{h1}$ and finding the corresponding effective shear stiffness, $G_{12}^*2$ using step two.

7. The method of claim 6, wherein once R and $N_{hf}$ are found, changing the initial values for $N_v$ and t and repeating step two again for the new combination of $N_v$ and t.

8. The method of claim 7, further comprising reporting the resulting structures for each topology combination along with their effective properties.

9. A tire made with a shear band that has a shear layer designed according to the method of claim 5.

* * * * *